United States Patent
Kim et al.

(10) Patent No.: US 11,201,144 B2
(45) Date of Patent: Dec. 14, 2021

(54) ELECTROSTATIC DISCHARGE HANDLING FOR SENSE IGBT USING ZENER DIODE

(71) Applicant: SEMICONDUCTOR COMPONENTS INDUSTRIES, LLC, Phoenix, AZ (US)

(72) Inventors: Hye-Mi Kim, Bucheon (KR); Kyu-hyun Lee, Bucheon (KR); Youngchul Kim, Gimpo-si (KR); Seunghyun Hong, Seoul (KR)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 15 days.

(21) Appl. No.: 16/675,875

(22) Filed: Nov. 6, 2019

(65) Prior Publication Data
US 2021/0111171 A1    Apr. 15, 2021

Related U.S. Application Data

(60) Provisional application No. 62/912,760, filed on Oct. 9, 2019.

(51) Int. Cl.
| | |
|---|---|
| *H01L 29/861* | (2006.01) |
| *H01L 27/02* | (2006.01) |
| *H01L 27/06* | (2006.01) |
| *H01L 29/78* | (2006.01) |
| *H01L 29/06* | (2006.01) |
| *H01L 29/866* | (2006.01) |
| *H01L 29/739* | (2006.01) |

(52) U.S. Cl.
CPC ...... *H01L 27/0248* (2013.01); *H01L 27/0647* (2013.01); *H01L 29/0615* (2013.01); *H01L 29/0646* (2013.01); *H01L 29/7393* (2013.01); *H01L 29/7813* (2013.01); *H01L 29/866* (2013.01); *H01L 29/8611* (2013.01)

(58) Field of Classification Search
CPC ............. H01L 27/0248; H01L 27/0647; H01L 29/0615; H01L 29/0646; H01L 29/7393; H01L 29/7813; H01L 29/8611; H01L 29/866

See application file for complete search history.

(56) References Cited

U.S. PATENT DOCUMENTS

| | | | |
|---|---|---|---|
| 5,200,878 A | 4/1993 | Sasagawa et al. | |
| 2013/0009206 A1 | 1/2013 | Soeno | |
| 2015/0084533 A1* | 3/2015 | Naito | H01L 27/0203 315/209 T |
| 2015/0325558 A1* | 11/2015 | Hikasa | H01L 24/06 257/49 |
| 2018/0108764 A1* | 4/2018 | Ishii | H01L 29/7393 |
| 2018/0166436 A1 | 6/2018 | Sato | |

FOREIGN PATENT DOCUMENTS

WO    20140188570 A1    11/2014

* cited by examiner

*Primary Examiner* — Timor Karimy
(74) *Attorney, Agent, or Firm* — Brake Hughes Bellermann LLP (57) ABSTRACT

A main Insulated Gate Bipolar Transistor (IGBT) and a sense IGBT may have a sense resistor connected between a sense emitter of the sense IGBT and a main emitter of the main IGBT. Back-to-back Zener diodes may be connected between a sense gate of the sense IGBT and the sense emitter, and configured to clamp a voltage between the sense gate and the sense emitter during an electrostatic discharge (ESD) event.

11 Claims, 10 Drawing Sheets

ELECTROSTATIC DISCHARGE HANDLING FOR SENSE IGBT USING ZENER DIODE

CROSS-REFERENCE TO RELATED APPLICATIONS

This application claims the benefit of U.S. Provisional Patent Application No. 62/912,760, filed on Oct. 9, 2019, the entire contents of which is incorporated herein by reference.

TECHNICAL FIELD

This description relates to the handling of electrostatic discharge for Insulated Gate Bipolar Transistor (IGBT) devices.

BACKGROUND

Electrostatic discharge (ESD) is a common difficulty in the manufacture and use of semiconductor transistors and related devices. ESD may occur, for example, due to an electrostatic charge imparted by a person or tool coming into unintentional contact with a conductive portion of a transistor. Such ESD has the potential to damage or destroy an affected transistor, and disrupt operations of connected circuitry and devices.

In particular, a transistor that is an ultra high voltage (UHV) device is susceptible to ESD damage. Existing models or standards for testing against device failure due to ESD, such as the Human Body Mode (HBM), demonstrate that existing ESD protection schemes provide protection up to about 1.5 kilovolts (kV), which is likely to be insufficient in many cases for UHV devices.

For example, insulated gate bipolar transistor (IGBT) devices may be used in such high power, UHV scenarios, while providing advantages such as fast switching and high efficiency. IGBT devices may be constructed in different manners (e.g., planar or trench gates), and may be constructed with differing types of layouts on an underlying substrate. Although ESD protection schemes have been developed for many scenarios requiring IGBT devices, such ESD protection schemes may not be sufficient to provide ESD protection in all IGBT use cases.

SUMMARY

According to one general aspect a semiconductor transistor device includes a main Insulated Gate Bipolar Transistor (IGBT) having a main gate, a main collector, and a main emitter. The semiconductor transistor device may include a sense IGBT having a sense gate, a sense collector, and a sense emitter, the sense gate being electrically connected to the main gate, and the sense collector being electrically connected to the main collector, and a sense resistor connected between the sense emitter and the main emitter. Back-to-back Zener diodes may be connected between the sense gate and the sense emitter, and configured to clamp a voltage between the sense gate and the sense emitter during an electrostatic discharge (ESD) event.

According to another general aspect, a semiconductor transistor device may include a substrate, and an epitaxial layer formed on the substrate. The semiconductor transistor device may include a main emitter region formed in the epitaxial layer and isolated by at least a first junction termination extension (JTE), the main emitter region forming a main emitter of a main Insulated Gate Bipolar Transistor (IGBT). The semiconductor transistor device may include a first plurality of gate trenches formed in the main emitter region and forming a main gate of the main IGBT, and a sense emitter region formed in the epitaxial layer and isolated by at least a second JTE, the sense emitter region forming a sense emitter of a sense IGBT. The semiconductor transistor device may include a second plurality of gate trenches formed in the sense emitter region and forming a sense gate of the sense IGBT, and electrically connected to the main gate of the main IGBT. The semiconductor transistor device may include a polysilicon layer having alternating n-doped and p-doped regions forming back-to-back Zener diodes, and connected between a gate contact common to the main gate and the sense gate, and a sense emitter contact of the sense emitter.

According to another general aspect, a method of making a semiconductor transistor device may include forming a substrate, and forming an epitaxial layer on the substrate. The method may include forming a main emitter region formed in the epitaxial layer and isolated by at least a first junction termination extension (JTE), the main emitter region forming a main emitter of a main Insulated Gate Bipolar Transistor (IGBT), and forming a first plurality of gate trenches formed in the main emitter region and forming a main gate of the main IGBT. The method may include forming a sense emitter region formed in the epitaxial layer and isolated by at least a second JTE, the sense emitter region forming a sense emitter of a sense IGBT, and forming a second plurality of gate trenches formed in the sense emitter region and forming a sense gate of the sense IGBT, and electrically connected to the main gate of the main IGBT. The method may include forming a polysilicon layer having alternating n-doped and p-doped regions forming back-to-back Zener diodes, and connected between a gate contact common to the main gate and the sense gate, and a sense emitter contact of the sense emitter.

The details of one or more implementations are set forth in the accompanying drawings and the description below. Other features will be apparent from the description and drawings, and from the claims.

DETAILED DESCRIPTION

The transistor devices described herein can include Zener diode protection schemes for ESD protection with respect to current flow between a gate and sense emitter of a sense IGBT used to sense current flow within a primary or main IGBT device, even when the sense IGBT has isolated junction voltages with respect to the main IGBT device. Moreover, by providing back-to-back Zener diodes, it is possible to provide bidirectional ESD protection, i.e., for both forward and reverse current between the gate and the sense emitter. Further, related processing steps for manufacturing the sense IGBT with Zener diode(s) for ESD protection between the gate and sense emitter of a sense IGBT may be performed inexpensively, and with minimal modifications as compared to conventional processes.

In more detailed examples, some circuits using a sense IGBT and a main IGBT, as referenced above, isolate the sense IGBT from the main IGBT using an isolation region. In particular, for example, such isolation may be required or useful when a sense resistor for current sensing is added between a sense emitter and a main emitter. For example, such isolation schemes may be used in industrial motor drive applications.

In such cases, current division may be implemented between the sense current and the main current. Further, because the sense IGBT is much smaller than the main IGBT, the sense IGBT may be much more sensitive to the need for ESD protection. However, in the types of use cases referenced above, such as industrial motor drive applications, ESD performance of HBM>2000V may be required. By adding a Zener diode(s) between a gate and sense emitter of a sense IGBT as described herein, an ESD performance of described circuits may be improved.

Although many of the examples herein are discussed in the context of a particular conductivity type (e.g., p-type conductivity, n-type conductivity) by way of example, the conductivity types, in some implementations, can be reversed.

Figure 1:
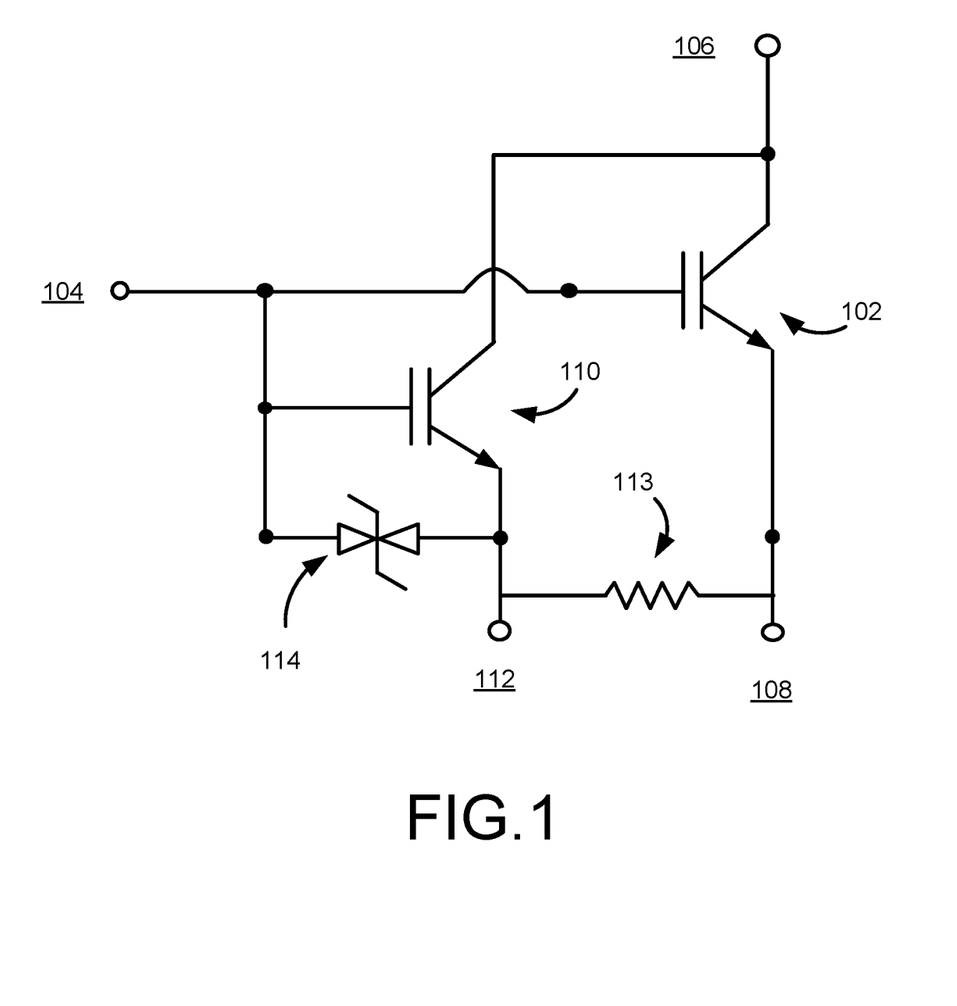
FIG. 1 is a circuit diagram illustrating ESD protection for a sense IGBT using at least one Zener diode.

In the example of FIG. 1, a main IGBT 102 represents a number of IGBT devices used for a primary purpose, such as, e.g., an industrial motor drive application. In general, and as discussed in detail, below, the main IGBT 102 represents a relatively large number of IGBT devices (e.g., on the order of thousands of IGBT devices, formed on an underlying substrate), each having a main gate implemented as, e.g., a gate trench, and connected to a common gate contact, illustrated in FIG. 1 as gate 104. Similarly, a common collector contact may be electrically connected to main collector regions of the main IGBT 102, and is illustrated in FIG. 1 as collector 106. A common main emitter contact may be connected to a plurality of main emitter regions (which may be referred to herein collectively as a main emitter region), and is illustrated in FIG. 1 as main emitter 108.

Further in FIG. 1, a sense IGBT 110 represents a much smaller number of IGBT devices, used to monitor and sense a current through the main IGBT 102. In more detail, an implementation of the circuit of FIG. 1 might have a ratio defined between a number of sense IGBT devices 110 and a number of main IGBT devices 102. Then, a sense current flow through the sense IGBT devices 110 will generally be proportional to a main current flow through the main IGBT devices 102, so that sensing the sense current provides useful information regarding the main current.

FIG. 1 is a simplified circuit diagram illustrating electrical connections between the main IGBT 102 and the sense IGBT 110, as implemented using corresponding electrical contacts. For example, the gate 104 of FIG. 1, when referenced as such, may be understood to represent a common gate contact connecting a main gate of the main IGBT 102 and a sense gate of the sense IGBT 110. Similar comments apply to the collector 106 of FIG. 1, which, when referenced as such with respect to FIG. 1, represents a common collector contact connected to a sense collector and a main collector. Further in FIG. 1, the term sense emitter 112 collectively refers to a sense emitter region and sense emitter contact, while the term main emitter 108 collectively refers to a main emitter region and main emitter contact.

The main IGBT 102 may be susceptible to various overcurrent conditions during normal operations thereof, which may damage the main IGBT 102 and/or related circuits. The sense IGBT 110 may be designed to enable fast, accurate current sensing with respect to the main current, so that appropriate measures may be taken. For example, the main current may quickly be turned off in response to a detected overcurrent condition, in order to minimize or eliminate the types of damage referenced above.

As referenced, for example, a current sensing resistor 113 (illustrated further in FIGS. 7 and 9) may be connected between a sense emitter 112 of the sense IGBT 110 and the main emitter 108, so that, as described below with respect to FIG. 9, the sense current may be measured through such a sense resistor 113. As referenced above, and described and illustrated in more detail below with respect to FIGS. 7 and 9, having an isolation region between the sense emitter 112 and the main emitter 108 may cause current division of the current flowing from the collector 106 through the sense IGBT 110 and main IGBT 102.

As also referenced above, the circuit of FIG. 1 may be susceptible to various types of ESD-related damage. As ESD is a known problem, a number of different types of ESD protection schemes have been implemented with respect to IGBT devices. Many such ESD protection schemes are limited to providing ESD protection at levels of, e.g., HBM<2000V, which may be insufficient for UHV applications. Moreover, such ESD protection schemes are generally constructed with respect to the main IGBT 102.

However, when the circuit of FIG. 1 is used in particular applications, such as industrial motor drive applications, an underlying device structure of the circuit of FIG. 1 may include the types of isolation structures referenced above, which, in conjunction with inclusion of the sense resistor 113, may result in current division between the IGBTs 102, 110. Because the sense IGBT 110 is much smaller than the main IGBT 102, the sense IGBT 110 is also more sensitive to a need for ESD protection in such scenarios. Moreover, any ESD protection that may be provided with respect to the main IGBT 102 will not be able to provide ESD protection to the sense IGBT 110.

Consequently, as shown in FIG. 1, at least one gate-sense Zener diode(s) 114 is illustrated, implemented in FIG. 1 as back-to-back Zener diodes connected between the gate 104 and the sense emitter 112. As described and illustrated herein, the back-to-back Zener diodes 114 are connected between the gate and the sense emitter, and configured to clamp a gate-sense emitter voltage during an electrostatic discharge (ESD) event. The back-to-back gate-sense Zener diodes 114 thus provide a high level of ESD protection for the circuit of FIG. 1, even when isolated junction voltages exist between the sense emitter 112 and the emitter 108. Moreover, by providing the back-to-back Zener diodes 114 as illustrated, ESD protection is provided with respect to both forward and reverse current flows between the gate 104 and the sense emitter 112.

In the simplified example of FIG. 1, the main Insulated Gate Bipolar Transistor (IGBT) 102 has a main gate, a main collector, and a main emitter, and a sense IGBT 110 having a sense gate, a sense collector, and a sense emitter, with the sense gate being electrically connected to the main gate by way of the common gate contact 104, and the sense collector being electrically connected to the main collector by way of the common collector contact 106. The sense resistor 113 is connected between the sense emitter and the main emitter, and the back-to-back Zener diodes 114 are connected between the sense gate and the sense emitter, and configured to clamp a voltage between the sense gate and the sense emitter during an electrostatic discharge (ESD) event.

Figure 2A:
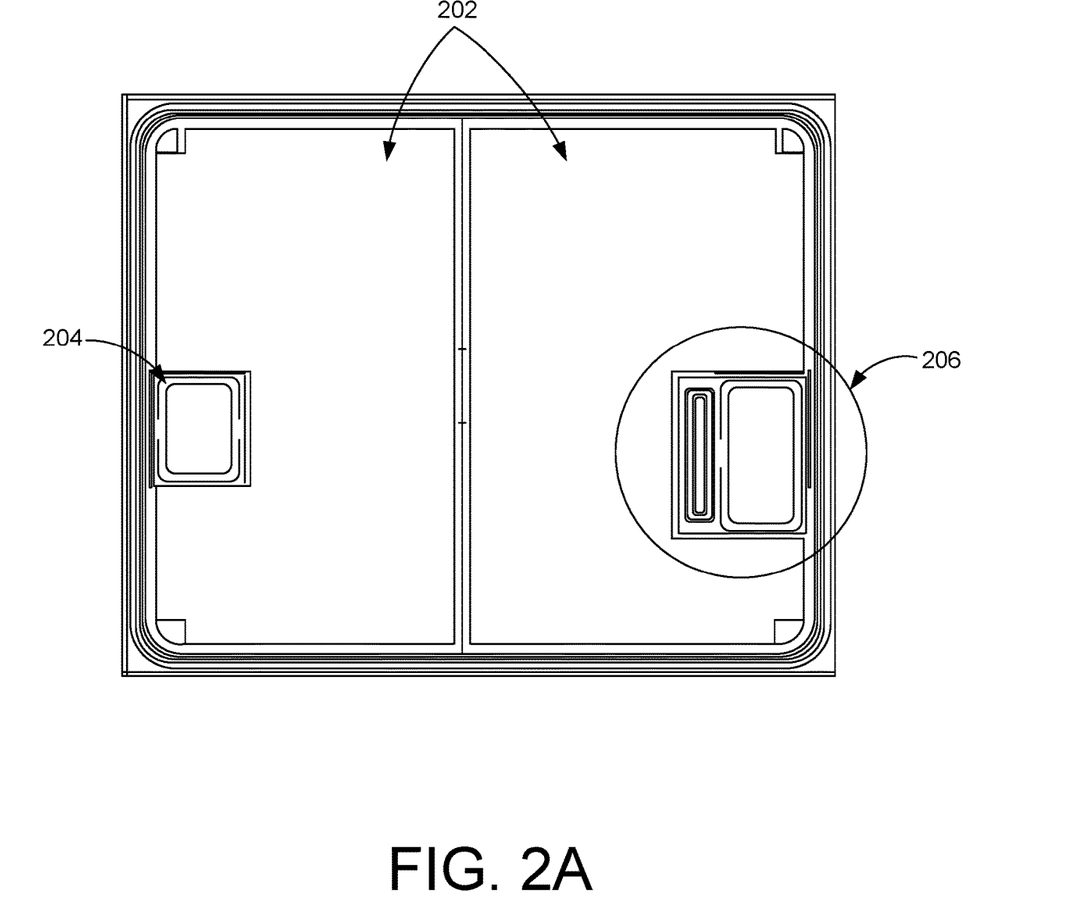
FIG. 2A is a first top view of an example implementation of the circuit of FIG. 1.

FIG. 2A is a top view of an example implementation of the circuit of FIG. 1. In the example of FIG. 2A, an emitter area 202 of a main IGBT (such as the main IGBT 102 of FIG. 1) is illustrated, and corresponds to the emitter 108 of FIG. 1. The main emitter area 202 is illustrated as having a gate pad 204, which may be electrically connected to gate lines or gate trenches (not shown in FIG. 2A, but illustrated and described with respect to FIGS. 3 and 7-9) traversing the main emitter area 202. Further in FIG. 2A, a sense cell 206 corresponds to the sense IGBT 110.

Figure 2B:
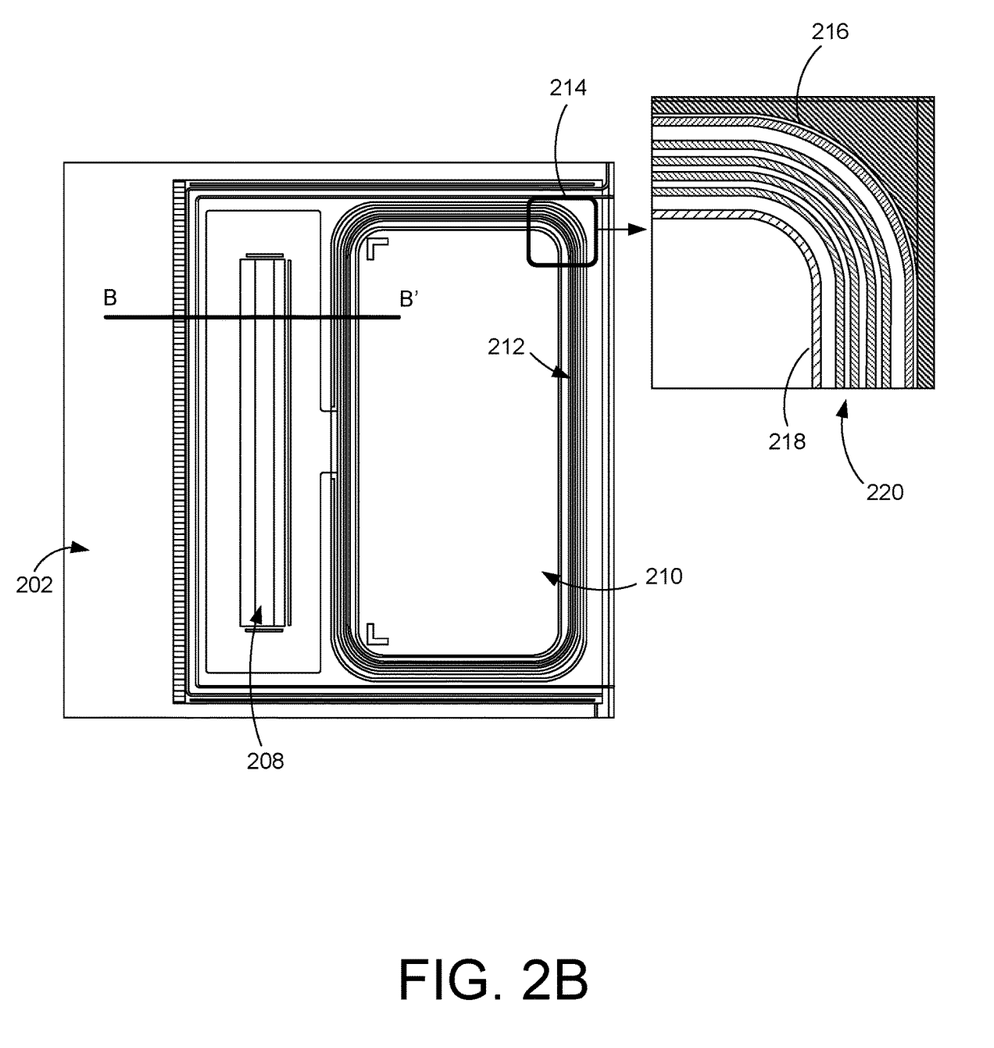
FIG. 2B is a second top view of the circuit of FIG. 1, illustrating an implementation of the at least one Zener diode of FIG. 1.

FIG. 2B is a second top view of an example implementation of the circuit of FIG. 1. In the example of FIG. 2B, the sense cell 206 is expanded to better illustrate a sense emitter 208 and a sense pad 210. A gate-sense Zener diode 212 is formed such that, as illustrated in expanded view of a portion 214, a gate contact 216 and a sense contact 218 may have the Zener diode(s) 212 (analogous to Zener diodes 114 of FIG. 1) formed therebetween. Specifically, the Zener diode(s) 212 may be formed using alternating n/p portions of doped semiconductor material, e.g., illustrated as the n/p/n/p/n structure 220 in FIG. 2B. As may be appreciated from the below discussion of FIGS. 3-7, such a Zener diode(s) structure 220 may easily and/or inexpensively be incorporated into a manufacturing process for manufacturing the circuit of FIG. 1.

Figure 3:
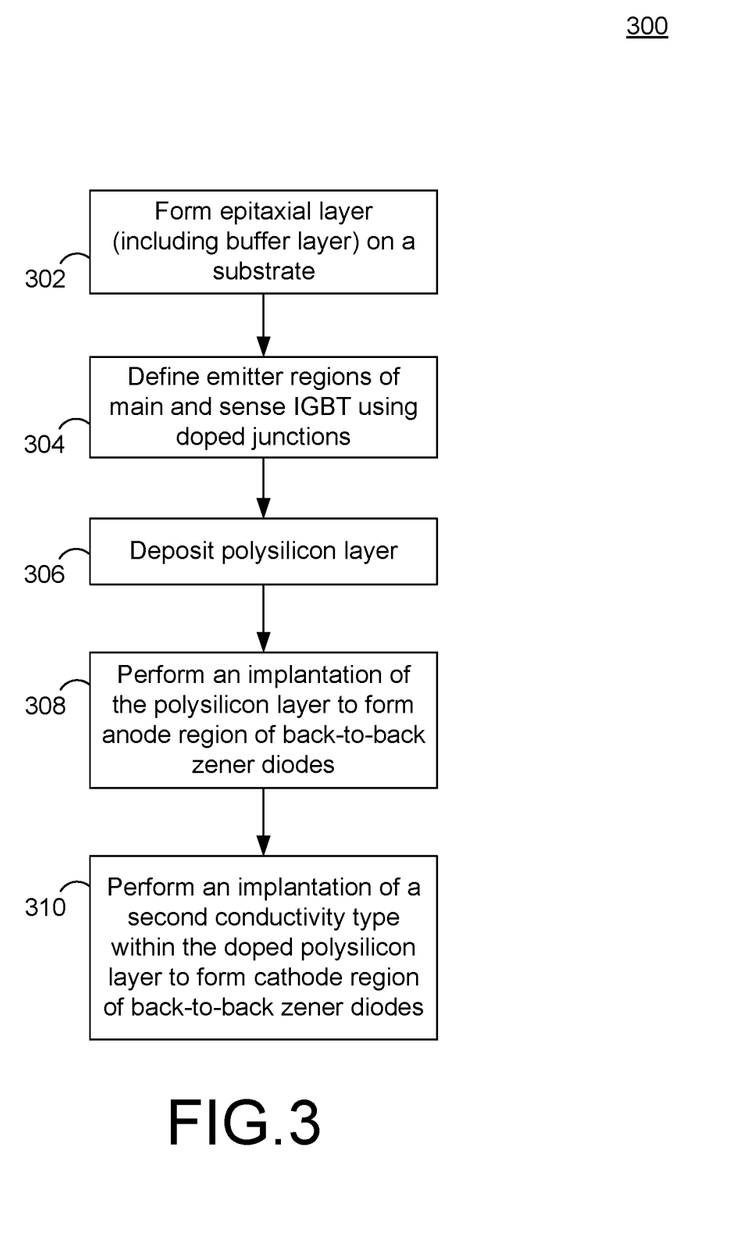
FIG. 3 is a flow chart illustrating example operations for a method for making a transistor structure in accordance with FIGS. 1, 2A, and 2B.
Figure 4:
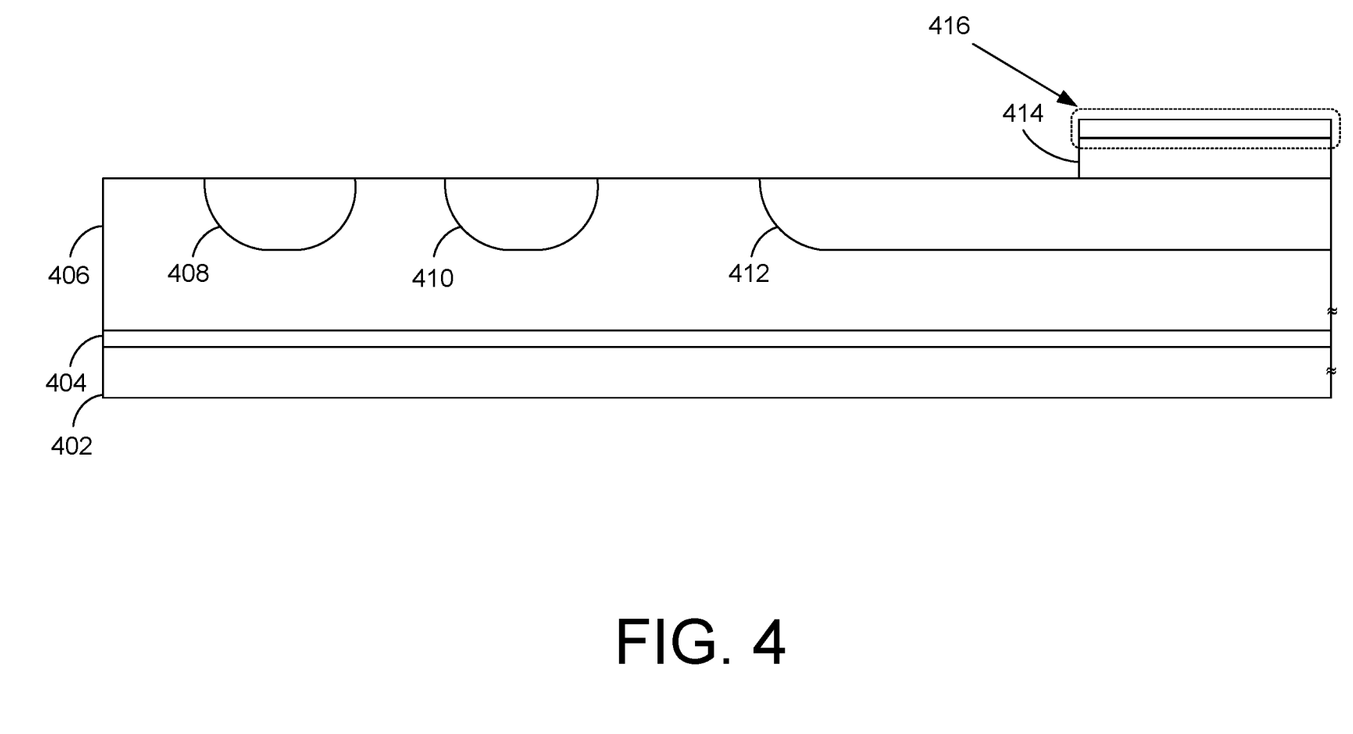
FIG. 4 is a first side cross section illustrating example implementations of process steps of the flow chart of FIG. 3.
Figure 5:
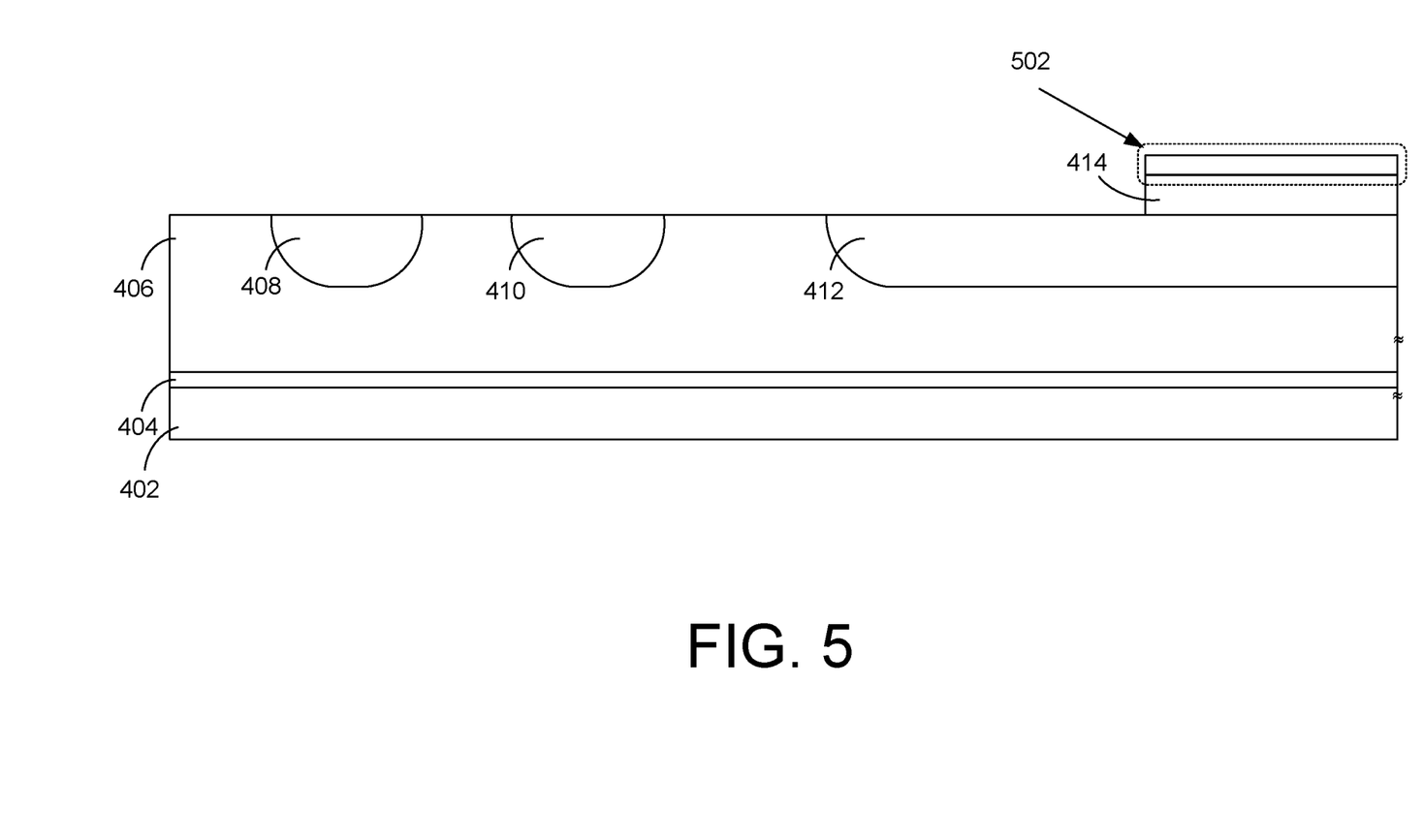
FIG. 5 is a second side cross section illustrating example implementations of process steps of the flow chart of FIG. 3.
Figure 6:
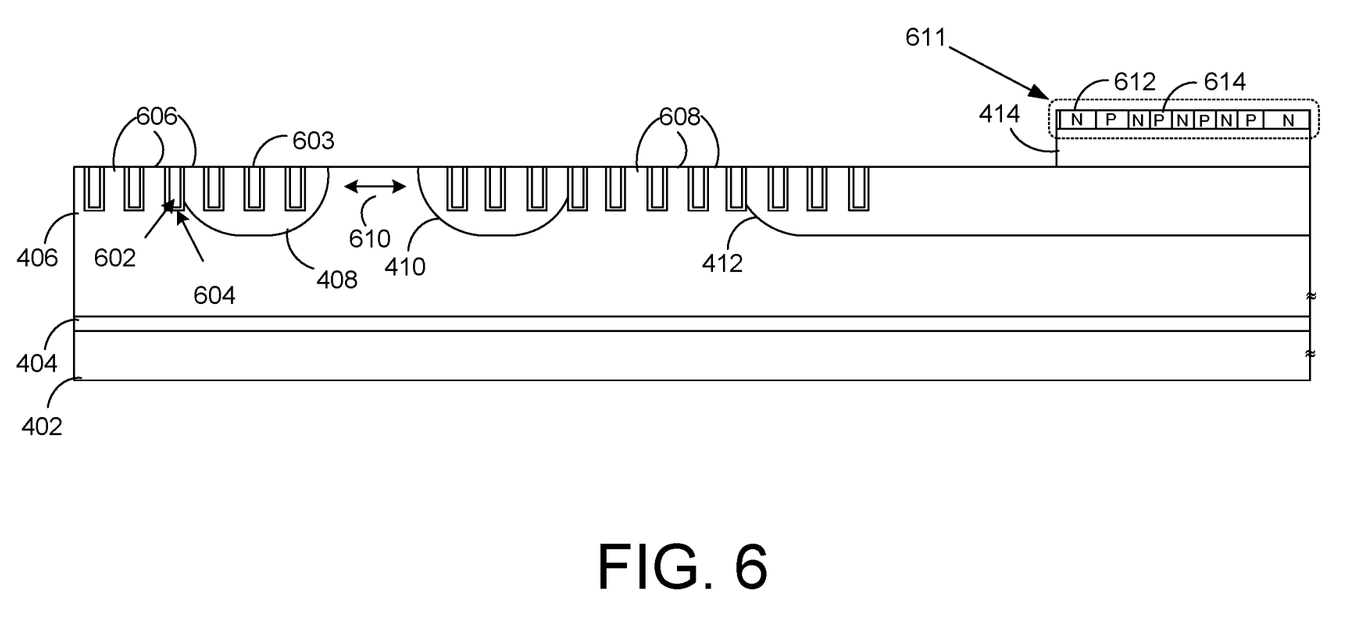
FIG. 6 is a third side cross section illustrating example implementations of process steps of the flow chart of FIG. 3.
Figure 7:
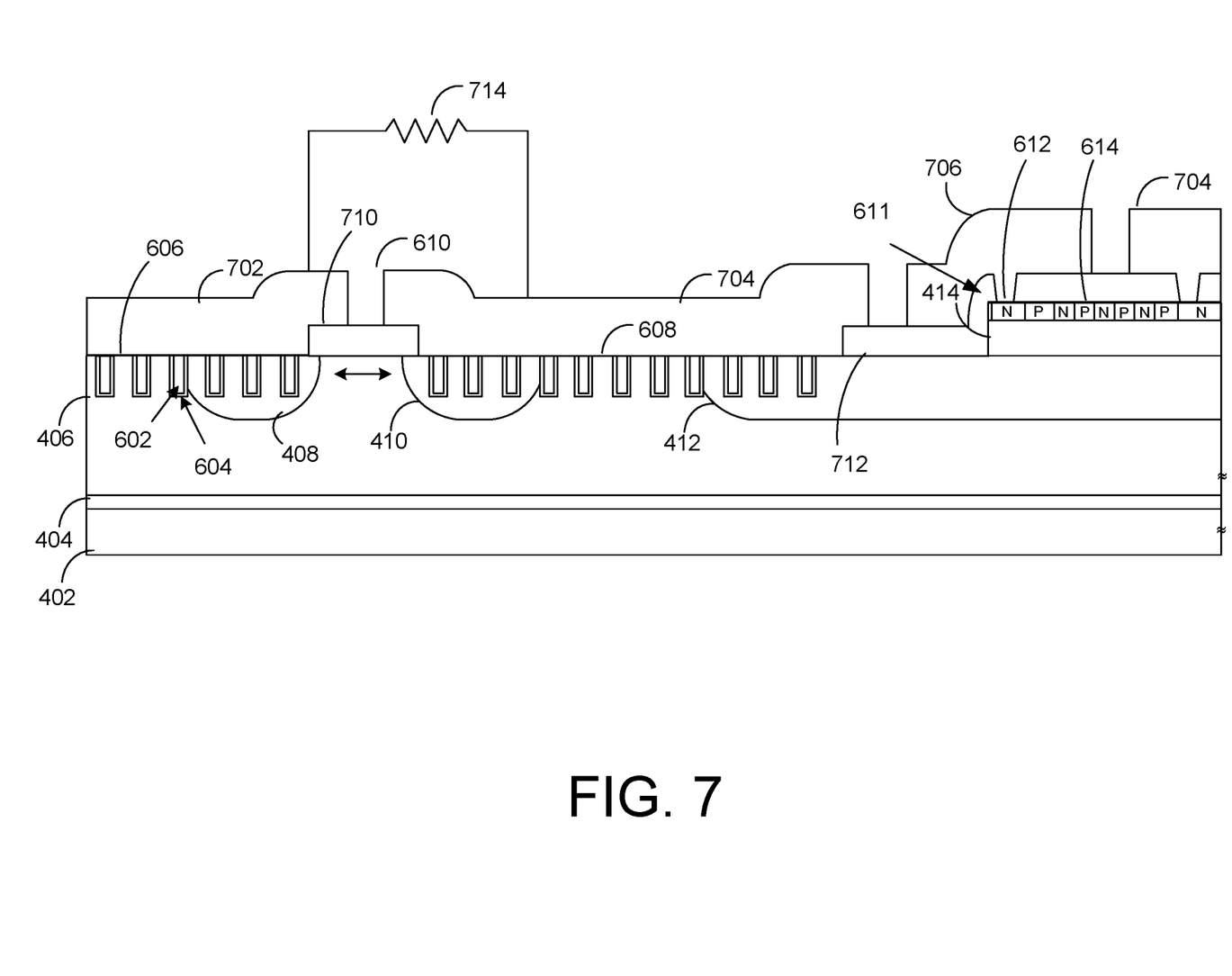
FIG. 7 is a fourth side cross section illustrating example implementations of process steps of the flow chart of FIG. 4.

For example, FIG. 3 is a flowchart 300 illustrating an example manufacturing process for manufacturing the circuit of FIG. 1. As described and illustrated below, FIGS. 4-7 are cross-sections of FIG. 2B, taken along lines B-B'. FIGS. 4-6 illustrate example implementations of corresponding processing steps 302-310 of the example of FIG. 3. In particular, FIG. 4 corresponds generally to blocks 302-306 of FIG. 3. FIG. 5 corresponds generally to operation 308 of FIG. 3. FIG. 6 corresponds generally to operation 310 of FIG. 3. FIG. 6, as well as FIG. 7, illustrate additional example aspects resulting from additional example processing operations for forming desired electrical contacts and other features not explicitly included in the example flowchart of FIG. 3.

As shown in FIG. 4, an epitaxial layer 406, including a buffer layer 404, is formed on a substrate 402 (corresponding method step shown at block 302 in FIG. 3). In some implementations, the buffer layer may be excluded.

Then, doped junctions 408, 410, 412 (e.g., p-doped junctions), as shown in FIG. 4 through 7, may be formed, e.g., as junction termination extension (JTE) regions (corresponding method step shown at block 304 in FIG. 3). As described below, the JTE regions 408, 410, 412 define emitter regions. More specifically, such JTEs 408, 410, 412 are used, e.g., to reduce surface field strengths, and to surround and protect active device areas (including shielding from external fields). In some implementations, the top view of FIGS. 2A and 2B show that the JTEs 408, 410 may define a ring formation JTE surrounding the sense emitter region 208 (not shown in FIG. 4, but illustrated in the examples of FIGS. 6 and 7 as sense emitter region 608).

As shown in FIG. 4, a polysilicon layer 416 may then be deposited on an insulating layer 414 (corresponding method step shown at block 306 in FIG. 3). As will be discussed below, the polysilicon layer 416 can be used for the formation of the back-to-back Zener diodes.

As shown in FIG. 5, an implantation of a first conductivity type (e.g., a p+ implantation) in the polysilicon layer 416 may be performed to form the polysilicon layer 502 (corresponding method step shown at block 308 in FIG. 3), which provides an anode region of the back-to-back Zener diodes as described herein.

An implantation of a second conductivity type may be performed (corresponding method step shown at block 310 in FIG. 3) within the doped, polysilicon layer 502 of FIG. 5 to form back-to-back Zener diodes 611. As shown, the back-to-back Zener diodes 611 are defined by alternating n regions 612 (forming a cathode) and p regions 614 (forming an anode), formed on an insulating layer 414 above at least a portion of underlying JTE 412.

As also shown in FIG. 6, p-wells may be included to form emitter region 606, as well as sense emitter region 608. Gate trenches 603 are formed in which corresponding gate oxidations 604 and gate polysilicon 602 may be formed. As also illustrated in FIG. 6, an isolation region 610 is thus defined between JTE 408 and JTE 410, which isolates the main emitter region 606 from the sense emitter region 608. That is, as shown, the term main emitter region refers to the various p-wells 606 that are interspersed with the main gate(s) 602/604 within the trenches 603 on the main emitter side of the isolation region 610, while the term sense emitter region refers to p-wells 608 that are interspersed with the sense gates 602/604 within the trenches 603 on the sense emitter side of the isolation region 610.

In FIG. 7, contact area formation may include forming Borophosphosilicate glass (BPSG) layers 710, 712, including the BPSG layer 710 above the isolation region 610. In some implementations, the layers 710, 712 can be a different type of insulating or dielectric material. Gate contact 706 and emitter contact 702, 704 may be included, as well.

Also in FIG. 7, an external sense resistor 714 is illustrated that demonstrates an example electrical connection between the sense emitter (contact) 704 and the main emitter (contact) 702, and that enables the type of current (sense) detection described above, e.g., with respect to FIG. 1. As referenced above, in order to be able to add the sense resistor 714 in the types of high-voltage (e.g., motor drive) applications described herein, it is desirable to separate or isolate the sense emitter and main emitter areas using the isolation region 610.

Figure 8:
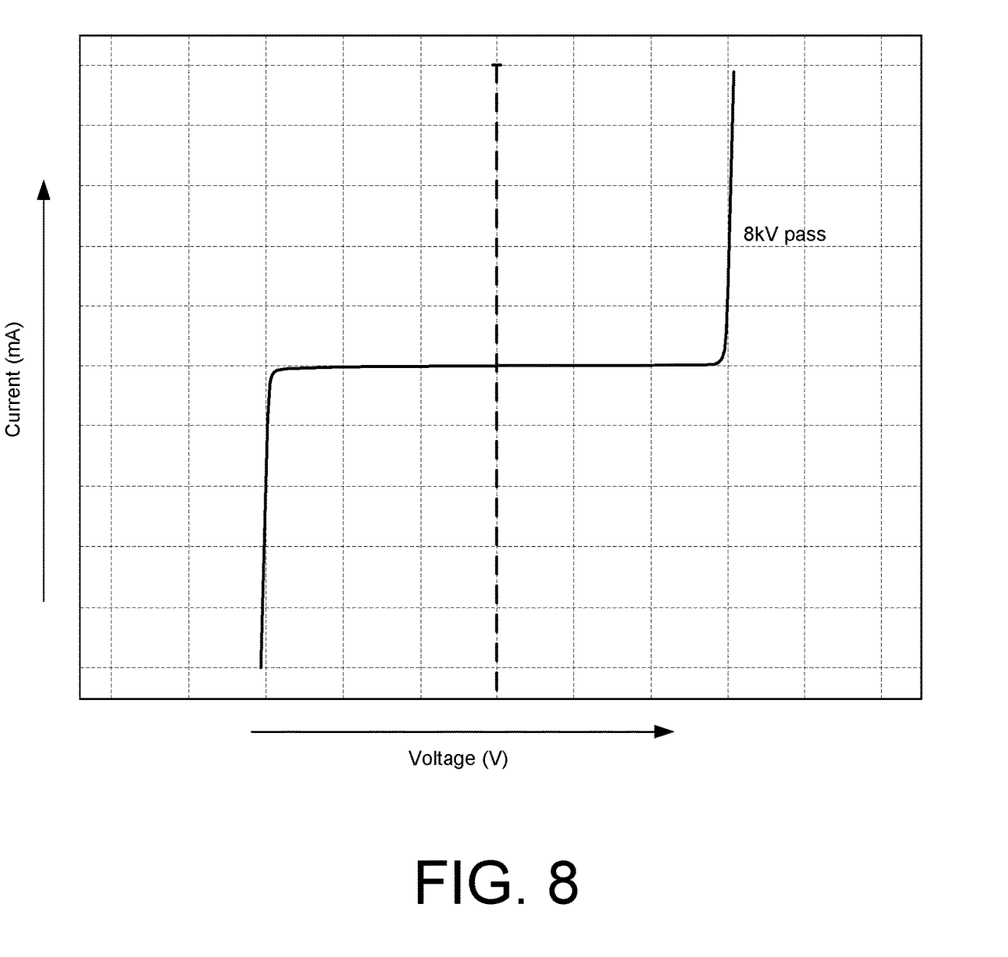
FIG. 8 is a graph of HBM performance provided by the back-to-back Zener diodes between a gate and sense emitter as described with respect to FIGS. 1-7.

FIG. 8 is a graph illustrating example overvoltage protection provided by the back-to-back Zener diode protection scheme described herein. As shown in FIG. 8, a gate-sense overvoltage condition may occur over a wide range of voltages, including, for example, a range of about 8 kV, without allowing unwanted and damaging gate-sense current flow.

Figure 9:
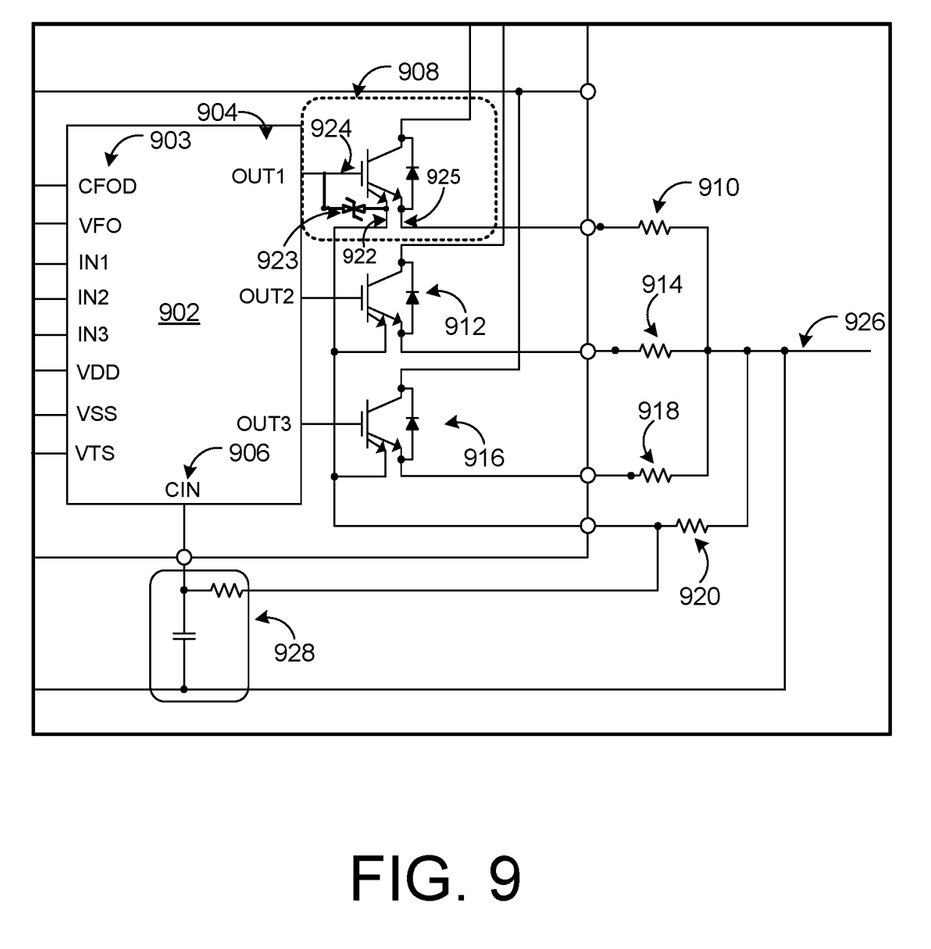
FIG. 9 is a circuit diagram illustrating an example use case for the implementations of FIGS. 1-7.

FIG. 9 is a circuit diagram illustrating an example use case for the implementations of FIGS. 1-7. In FIG. 9, a control chip 902 includes a plurality of input/control voltage pins 903 (e.g., inputs IN1, IN2, IN3, rail voltages VDD and VSS) that are not described here in detail, as well as three output pins 904. Further, a pin 906 is an over-current detection and shutdown pin that may be used to cease operations of the chip 902 upon detection of an overcurrent condition, as described below.

In FIG. 9, a transistor 908 illustrates an example of the implementation of FIG. 1, as also described in more detail below, and is connected to a shunt resistor 910. A transistor 912 is similarly connected to a shunt resistor 914, and a transistor 916 is similarly connected to a shunt resistor 918. The circuit of FIG. 9 may be used for three-phase current sensing, but further discussion of FIG. 9 is limited to the single phase current sensing that may occur using the transistor 908 and the shunt resistor 910. That is, it is assumed that the transistor 908 is ON while the transistors 912 and 914 are OFF, so that a voltage drop occurs across the shunt resistor 910 and a sense resistor 920, where the sense resistor 920 corresponds to the sense resistor 113 of FIG. 1, and the sense resistor 714 of FIG. 7.

In the transistor 908, a sense emitter 922 is connected by back-to-back Zener diodes 923 to a gate 924. As shown, the sense resistor 920 is thus connected between the sense emitter 922 and a main emitter 925, as described above with respect to FIGS. 1 and 7. As further illustrated, both the shunt resistor 910 and the sense resistor 920 are connected to a ground terminal 926.

Therefore, a sense current through the sense resistor 920, as detected at the CIN pin 906 using a RC (resistor-capacitor) filter 928, may be used to detect an overcurrent condition, so that all of the transistors 908, 912, 916 may be shut down. Put another way, a voltage drop at the sense resistor 920 is transferred to CIN 906 using the RC filter circuit 928.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor transistor device, comprising:
   a main Insulated Gate Bipolar Transistor (IGBT) having a main gate, a main collector, and a main emitter;
   a sense IGBT having a sense gate, a sense collector, and a sense emitter, the sense gate being electrically connected to the main gate, and the sense collector being electrically connected to the main collector;
   a sense resistor connected between the sense emitter and the main emitter; and
   back-to-back Zener diodes connected between the sense gate and the sense emitter, and configured to clamp a voltage between the sense gate and the sense emitter during an electrostatic discharge (ESD) event,
   wherein the main emitter includes a main emitter region formed on a substrate, and isolated by a first junction termination extension (JTE),
   a sense emitter region is formed in an epitaxial layer and isolated by a second JTE formed in a first ring formation surrounding the sense emitter region, the epitaxial layer including an electrically isolated area between the first JTE and the second JTE, and
   the back-to-back Zener diodes are formed in a second ring formation on a polysilicon layer that is formed on an insulating layer above a portion of at least the second JTE.

2. The semiconductor transistor device of claim 1, wherein the back-to-back Zener diodes are formed using alternating n-doped and p-doped regions connected between a gate contact of the sense gate and a sense emitter contact of the sense emitter.

3. The semiconductor transistor device of claim 2, wherein the alternating n-doped and p-doped regions includes at least two n-doped regions and at least two p-doped regions.

4. The semiconductor transistor device of claim 1, further comprising:
   a first plurality of gate trenches formed in the main emitter region and forming at least a portion of the main gate.

5. The semiconductor transistor device of claim 4, further comprising:
   a second plurality of gate trenches formed in the sense emitter region and forming at least a portion of the sense gate.

6. The semiconductor transistor device of claim 1, wherein the second ring formation at least partially surrounds a sense contact of the sense emitter and is at least partially surrounded by a gate contact connecting the sense gate and the main gate.

7. The semiconductor transistor device of claim 1, wherein a sense current through the sense resistor is proportional to a main current through the main emitter.

8. A semiconductor transistor device, comprising:
   a substrate;

a main emitter region formed on the substrate and isolated by a first junction termination extension (JTE), the main emitter region forming a main emitter of a main Insulated Gate Bipolar Transistor (IGBT);

a first plurality of gate trenches formed in the main emitter region and forming a main gate of the main IGBT;

a sense emitter region formed in an epitaxial layer and isolated by a second JTE, the sense emitter region forming a sense emitter of a sense IGBT;

a second plurality of gate trenches formed in the sense emitter region and forming a sense gate of the sense IGBT, and electrically connected to the main gate of the main IGBT; and a polysilicon layer having alternating n-doped and p-doped regions forming back-to-back Zener diodes, and connected between a gate contact common to the main gate and the sense gate, and a sense emitter contact of the sense emitter, wherein the sense emitter region is isolated by the second JTE being formed in a first ring formation surrounding the sense emitter region, and the epitaxial layer includes an electrically isolated area between the first JTE and the second JTE, and the back-to-back Zener diodes are formed in a second ring formation on a polysilicon layer that is formed on an insulating layer above at least a portion of the second JTE.

9. The semiconductor transistor device of claim 8, wherein the alternating n-doped and p-doped regions includes at least two n-doped regions and at least two p-doped regions.

10. The semiconductor transistor device of claim 8, wherein the sense IGBT is configured to provide current sensing of a current flow through the main IGBT.

11. The semiconductor transistor device of claim 10, wherein the current sensing is provided using a sense resistor connected between the main emitter and the sense emitter.

* * * * *